US006535434B2

(12) United States Patent
Maayan et al.

(10) Patent No.: US 6,535,434 B2
(45) Date of Patent: Mar. 18, 2003

(54) ARCHITECTURE AND SCHEME FOR A NON-STROBED READ SEQUENCE

(75) Inventors: Eduardo Maayan, Kfar Saba (IL); Yair Sofer, Tel Aviv (IL); Ron Eliyahu, Herzelia (IL); Boaz Eitan, Ra'anana (IL)

(73) Assignee: Saifun Semiconductors Ltd., Netanya (IL)

( * ) Notice: Subject to any disclaimer, the term of this patent is extended or adjusted under 35 U.S.C. 154(b) by 0 days.

(21) Appl. No.: 09/827,756

(22) Filed: Apr. 5, 2001

(65) Prior Publication Data

US 2002/0145918 A1 Oct. 10, 2002

(51) Int. Cl.[7] .................................................. G11C 7/00
(52) U.S. Cl. .................................... 365/189.07; 365/210
(58) Field of Search .............................. 365/189.07, 210, 365/185.2

(56) References Cited

U.S. PATENT DOCUMENTS

| 4,916,671 | A |   | 4/1990 | Ichiguchi | 365/233 |
|---|---|---|---|---|---|
| 5,142,495 | A | * | 8/1992 | Canepa | 365/210 |
| 5,335,198 | A | * | 8/1994 | Van Buskirk et al. | 365/210 |
| 5,381,374 | A | * | 1/1995 | Shiraishi et al. | 365/210 |
| 5,544,116 | A | * | 8/1996 | Chao et al. | 365/210 |
| 5,627,790 | A | * | 5/1997 | Golla et al. | 365/210 |
| 5,771,197 | A | * | 6/1998 | Kim | 365/210 |
| 5,963,465 | A |   | 10/1999 | Eitan | 365/63 |
| 5,986,940 | A |   | 11/1999 | Atsumi et al. | 365/185.3 |
| 6,128,226 | A |   | 10/2000 | Eitan et al. | 365/185.21 |
| 6,134,156 | A |   | 10/2000 | Eitan | 365/189.07 |
| 6,185,143 | B1 | * | 2/2001 | Perner et al. | 365/210 |
| 6,285,589 | B1 |   | 9/2001 | Kajitani | 365/185.21 |
| 6,339,556 | B1 | * | 1/2002 | Watanabe | 365/210 |

FOREIGN PATENT DOCUMENTS

| EP | 1 071 096 A | 1/2001 |
|---|---|---|
| JP | 10 334676 A | 12/1998 |

* cited by examiner

*Primary Examiner*—Tan T. Nguyen
(74) *Attorney, Agent, or Firm*—Eitan, Pearl, Latzer & Cohen-Zedek (57) ABSTRACT

An architecture and method for implementing a non-strobed operation on an array cell within a memory array in which a reference unit is provided for emulating the response of an array cell during a desired operation, for example, a read, program verify, erase verify or other types of read operations. The reference unit includes a reference cell which is driven by a non-strobed gate voltage. The architecture and method permit relatively noise-free array cell interrogations at close to ground voltage levels.

46 Claims, 7 Drawing Sheets

ARCHITECTURE AND SCHEME FOR A NON-STROBED READ SEQUENCE

CROSS-REFERENCE TO RELATED APPLICATION

This application is related to U.S. Pat. No. 6,128,226, issued Oct. 3, 2000 entitled "Method and Apparatus for Operating with a Close to Ground Signal", to U.S. Pat. No. 6,134,156, issued Oct. 17, 2000 entitled "Method for Initiating a Retrieval Procedure in Virtual Ground Arrays", to U.S. application Ser. No. 09/827,757, filed on even date herewith, entitled "Method for Programming a Reference Cell", the foregoing patents and patent application being incorporated in their entities as if set forth herein.

FIELD OF THE INVENTION

The present invention relates to devices for operate with close to ground signals, in general, and to devices for sensing such a signal which is received from a memory cell, in particular.

BACKGROUND OF THE INVENTION

Memory devices, such as random access memory (RAM), read-only memory (ROM), non-volatile memory (NVM) and like, are known in the art.

These devices provide an indication of the data which is stored therein by providing an output electrical signal. A device called a sense amplifier is used for detecting the signal and determining the logical content thereof. U.S. Pat. No. 4,916,671 to Ichiguchi describes one such sense amplifier.

In general, prior art sense amplifiers determine the logical value stored in a cell by comparing the output of the cell with a threshold voltage level. If the output is above the threshold, the cell is determined to be erased (with a logical value of 1) and if the output is below the threshold, the cell is determined to be programmed (with a logical value of 0). The threshold level is typically set as a voltage level between the expected erased and programmed voltage levels which is high enough (or sufficiently far from both expected voltage levels) so that noise on the output will not cause false results. Typically, the expected erased and programmed voltage levels are 1.5V and 2.5V, respectively, and the threshold level is 2V.

Unfortunately, a high threshold level requires that the cell being sensed be given a sufficient amount of time to fully develop its signal thereby ensuring that, for an erased cell, the resultant signal has reached its full (high) voltage level. In order to achieve this in a reasonable amount of time, the entire array is first brought (or "equalized") to a medium voltage level which the cell being sensed either increases (if it is erased) or decreases (if it is programmed). The equalization operation is time-consuming and requires a considerable amount of power.

The aforementioned U.S. Pat. Nos. 6,134,156 and 6,128,226 describe an alternative circuit architecture in which a reference cell is used in lieu of a fixed threshold voltage value. The architecture of those patents calls for a timing cell to accompany the reference cell in order to ensure that the sensing decision is made when the signal levels have reached a sufficient value at the input of the sense amplifier. This sensing scheme permits data retrieval at very low voltages, but is attendant with limitations. For example, certain read conditions such as a read cycle after an idle state and the situation in which the same word line is selected in consecutive read cycles (a read within read or "RWR" condition), can result in the word line voltage of the reference cell being either higher or lower than the word line voltage of the array cell. Consequently, the result of the comparison of the array and reference cell signals may differ during different read cycles. This situation may be avoided if enough time is allotted to the array cell and reference cell word lines to permit them to settle to their final levels. This greater time allotment, however, translates into a sacrifice in performance.

What is needed in the art is an improved sensing scheme and circuit architecture which reduces margin loss. The present invention satisfies this and other needs.

SUMMARY OF THE PRESENT INVENTION

The present invention provides a circuit architecture and sensing scheme in which the word line voltage applied to the operative reference cell is stable, and behaves the same way during all read cycles, regardless of the purpose of the read. Thus, a constant, non-zero word line voltage can be applied to the gate of a plurality of reference cells, each of which is configured as a reference against a prescribed operation such as a read operation, a program verify operation, an erase verify operation, or any other read operation (generally referred to herein as "read operations"). Consequently, there is no strobe signal applied to the reference cell.

According to one aspect of the present invention, a method for sensing a close to ground signal received from an array cell within a memory array is provided. The method includes the steps of providing a reference unit with a reference cell having a similar structure and a similar current path therethrough to that of the array cell and having a non-strobed word line voltage applied thereto. This method includes the additional steps of first discharging the array and the reference cell and then generating an array cell signal from the array cell and a reference signal from the reference cell. Further, a timing unit is provided that is operative to generate a digital timing signal that changes its state (e.g., changes from 0 volts to Vdd) when the reference signal reaches a predetermined level. A digital read signal is generated and output by the timing unit from the difference between the cell signal and the reference signal once the digital timing signal has been generated. The reference unit has a prescribed reference capacitance that can be equal to or can be a multiple of the expected capacitance of a bit line of the array.

According to another aspect of the present invention, an apparatus for sensing a close- to-ground array cell signal received from an array cell within a memory array is provided. The apparatus includes a reference unit, a timing unit and a differential comparator. The reference unit has reference cells whose structures emulate the response of an array cell and a reference capacitance that is equal to the expected capacitance of a bit line of the array. The reference cells are driven by a non-strobed word line voltage. The timing unit is operative to generate a digital timing signal. The differential comparator generates a digital read signal from the difference of the cell and reference signals once the timing signal is generated.

In a preferred implementation, the word line decoder of the memory array is free running (i.e., it has no strobe signal and a word line is always selected according to the address inputs). Furthermore, the word line voltage applied to the reference cell has the same value as the word line voltage supply applied to the selected array cell. In this implementation, a read cycle accessing an already selected word line (i.e., no X-address change) results in the word line voltage of the reference cell being identical to that of the array cell. At the opposite extreme, in which at least one X-address has changed, the preferred implementation presents a well-defined worst case scenario in terms of margin loss. A read cycle accessing an unselected word line will have a ramping array cell word line voltage compared to a reference cell having a constant word line voltage. Therefore, the array word line will never be higher than the reference word line. As a direct result, any margin loss that may exist, if any, will only affect readings of cells in the erased state. There will be no margin loss introduced for reading cells in the programmed state. Also, the second scenario described above defines the time at which sensing can safely start for that worst case situation. This differs from prior art methods and apparatus using a strobed X-decoder and a strobed word line since in those cases different types of read cycles could result in a margin loss for cells in either the erased or programmed states. Moreover, the worst case situation to determine the time at which sensing can safely start is not well defined in prior art schemes, thereby requiring an artificial timing margin to be introduced which sacrifices performance.

The inventive method and architecture can be utilized with a memory array, a sliced array having one or more columns of memory cells, and with redundant or auxiliary arrays.

BRIEF DESCRIPTION OF THE DRAWINGS

The present invention will be understood and appreciated more fully from the following detailed description taken in conjunction with the drawings in which.

DETAILED DESCRIPTION OF A PREFERRED EMBODIMENT

The present invention is a method and apparatus which senses a voltage that has risen from ground while the voltage level is still close to the ground level. Since sensing occurs close to ground level, the present invention is useful for memory arrays which are pre-charged to ground. Such a memory array is described in the aforementioned U.S. Pat. No. 6,134,156 and U.S. application Ser. No. 09/827,757, filed on even date herewith, entitled "Method For Programming a Reference Cell."

U.S. Pat. No. 6,134,156 describes that, after pre-charging to ground, the drain line of a cell to be read is pre-charged to a predetermined voltage level. When the sensing line is disconnected from the ground potential, the sensing line exhibits a voltage rise. In accordance with a preferred embodiment of the present invention, the state of a cell is determined or verified from its source line. By using a reference cell instead of a fixed threshold for comparison, a low voltage signal can be reliably processed irrespective of any changes in temperature or power supply level.

As used herein, the "drain" terminal of an N-channel memory device is always the terminal having the higher potential attached to it and the contents of a cell are read out from the "source" terminal. If a P-channel memory device were to be used, then the terminal from which the contents of the cell are read is the "drain" and the "source" would be the terminal having the higher potential attached to it.

Figure 1:
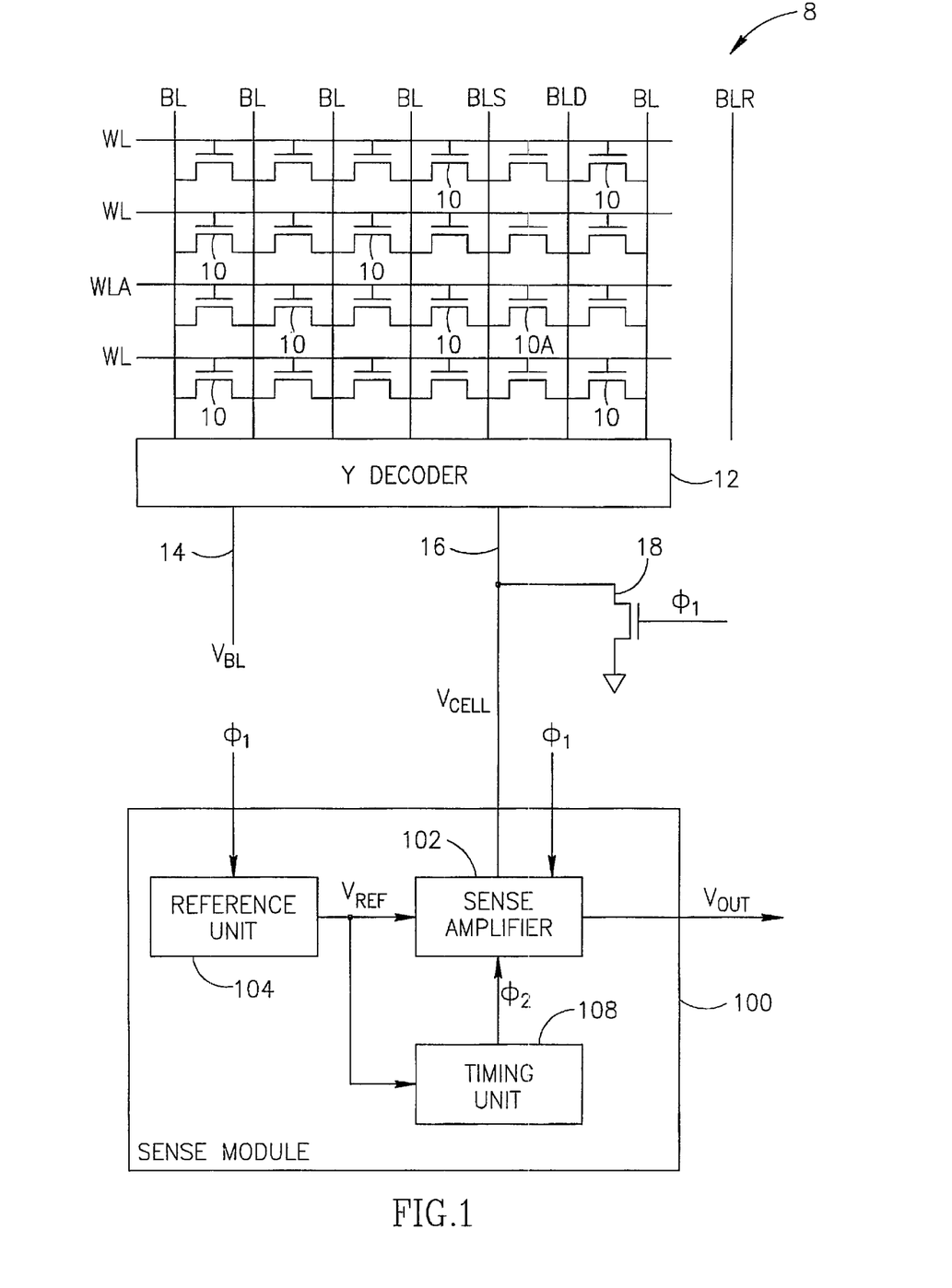
FIG. 1 is a schematic illustration of a memory cell and a sense amplifier, constructed and operative in accordance with a preferred embodiment of the present invention.

Reference is now made to FIG. 1, which is a schematic illustration of a memory array 8 and a sense amplifier 102 constructed and operative in accordance with a preferred embodiment of the present invention. Reference is also made to FIGS. 2A, 2B, 2C, 2D and 2E which illustrate the various aspects of timing associated with the present invention. The memory array has a multiplicity of cells 10, organized into rows and columns. The gates of a single row of cells are connected to a word line WL, the sources of a column of cells are connected to a bit line BL, as are the drains of the cells of that column. It is noted that the term "bit line" is used herein to mean a conducting line along which current is carried.

FIG. 1 shows a cell 10A to be read which is connected between two bit lines, labeled BLS and BLD, with its gate connected to a word line WLA. FIG. 1 also shows additional, reference bit line BLR located near the other bit lines BL of the array. The reference bit line BLR, described in more detail hereinbelow, has the same length and structure as the other bit lines BL of the array and is preferably located near the array. Furthermore, bit line BLR is pre-charged and discharged along with the other bit lines BL of the array.

It is noted that, in the embodiment described herein, the architecture of the array is symmetric such that, no matter where in the array the cell to be sensed is located, the length of the current path to it is constant. Such an architecture is described in U.S. Pat. No. 5,963,465, Oct. 5, 1999 and is incorporated herein by reference as if set forth in its entirety herein. It will be appreciated that the present invention can also be implemented in non-symmetric arrays.

All the bit lines BL are connected to a Y decoder 12. During sensing, Y decoder 12 connects bit line BLD to a supply line 14 having a supply voltage $V_{BL}$ thereon and bit line BLS to a sensing line 16. When a positive word line supply VCCR is applied to WLA, cell 10A responds and the voltage on sensing line 16 will change accordingly, to be measured by sense amplifier 102.

Sensing module 100 comprises a sense amplifier 102, a reference unit 104 and a timing unit 108. The sense amplifier 102 receives a voltage on sensing line 16, labeled $V_{CELL}$, a voltage $V_{REF}$ from reference unit 104 and a signal φ2 from timing unit 108, and produces a read output signal $V_{OUT}$ therefrom.

In accordance with a preferred embodiment of the present invention and as will be described in more detail hereinbelow, reference unit 104 includes a sensing emulator which emulates the elements found in the path from supply line 14, through cell 10A to be read, to sensing line 16, so that sense amplifier 102 will have approximately the same response to temperature, process variations and environmental conditions as cell 10A being read.

Furthermore, as will be described hereinbelow, sense amplifier 102 is formed of differential amplifiers and so any variation in supply Vdd which affects the input signals $V_{CELL}$ and $V_{REF}$ provided to sense amplifier 102 will cancel each other out. The sense amplifier preferably includes a first stage that shifts the input signals from a level lower than 500 mV to a level which is higher than 1V and at least one differential amplifying stage with a total gain greater than about 10. The sense amplifier includes an output driving stage controlled by a timing signal that provides the read output signal.

Connected to sensing line 16 is an NMOS switching transistor 18 that is controlled by a control signal φ1. Switching transistor 18 switchably connects sensing line 16 with either sense amplifier 102 or with a ground supply (not shown). When φ1 is high, switching transistor 18 is active, allowing connection between sensing line 16 and the ground supply, and thereby discharging sensing line 16 and bit line BLS. However, when φ1 is low, switching transistor 18 is inactive, which permits signal development on the sensing line 16.

Signal φ1 is also provided to reference unit 104 where it functions similarly, forcing the signals of interest to develop from the ground voltage, as will be described in more detail hereinbelow.

Figure 1A:
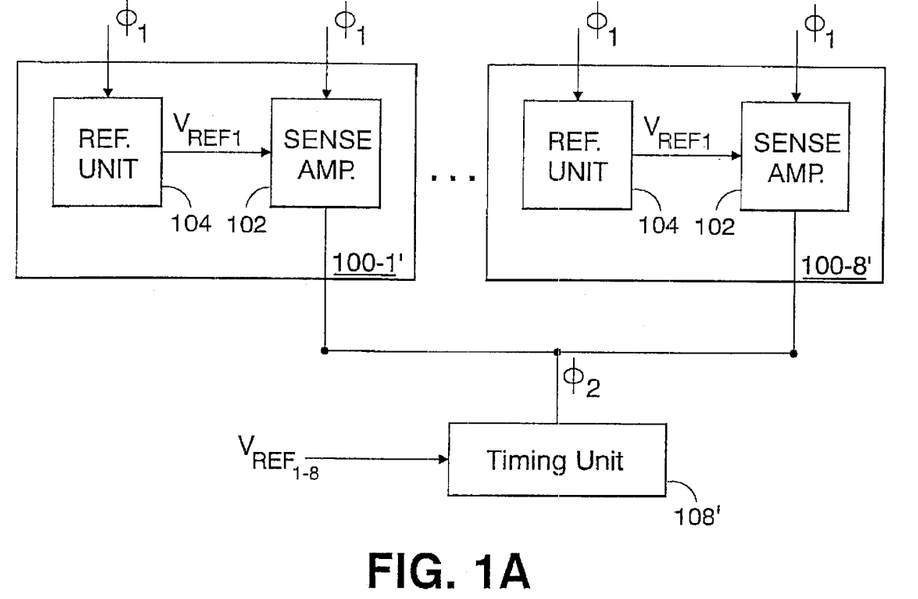
FIG. 1A is a schematic illustration of a first alternative arrangement for the sense module in which a single timing unit is shared among multiple sense amplifiers and associated reference units.

The sense module 100 of FIG. 1 generates one output datum $V_{OUT}$. Typically, a byte (i.e., eight bits) or a word (i.e., sixteen bits) or more, are read in parallel. The sense module 100 of FIG. 1 can be replicated for each bit that is to be read in parallel; however, that arrangement consumes a great amount of area on the die. There are benefits to dedicating a reference cell to a sense amplifier including the fact that the reference cell 150 (shown in FIG. 3) can be programmed to cancel any offset in the sense amplifier 102, as described in greater detail in co-pending U.S. application Ser. No. 09/827,757, entitled "Method for Programming a Reference Cell," the contents of which are hereby incorporated by reference as if set forth in its entirety herein. With reference to FIG. 1A, a first alternative construction for the sense module 100' is described. In the embodiment of FIG. 1A, each sense module includes a sense amplifier 102 and an associated reference unit 104. A single timing unit 108 is used to read out the data from the plural sense modules at the same time, namely, when the timing signal φ2 changes state. Each reference unit 104 preferably has a reference cell 150 which is programmed to compensate for any offset in its associated sense amplifier. The differences in programmed reference units of the plural sense modules 100' (e.g., sense modules 100-1' through 100-8' for outputting a byte at a time), if any, can be readily accommodated by changing the DC_REF level supplied to the timing unit 108' to a level sufficient to permit a reliable read operation, or by selecting the slowest to develop reference signal from among the reference units 104 of the plural sense modules 100' to ensure enough time for a reliable read operation. In any event, the input to the timing unit 108', when a single timing unit is shared among plural reference units, will be the VREF signal from one of the reference units (i.e., from one of $V_{REF-1}$, $V_{REF-2}$, $V_{REF-3}$, $V_{REF-4}$, $V_{REF-5}$, $V_{REF-6}$, $V_{REF-7}$, or $V_{REF-8}$) A similar embodiment can be constructed for any number of bits to be read in parallel.

Figure 1B:
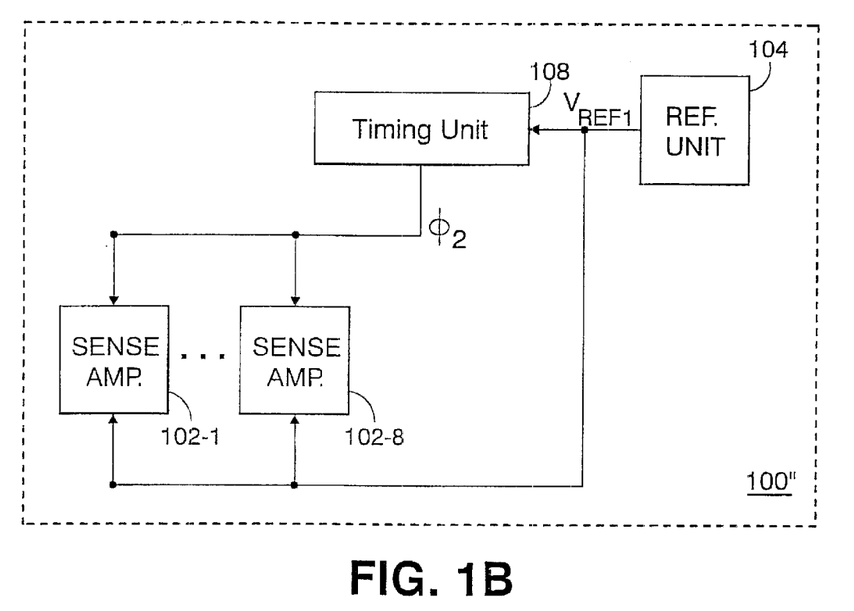
FIG. 1B is a schematic illustration of a second alternative arrangement for the sense module in which a single timing unit and a single reference unit are shared among multiple sense amplifiers.

Referring now to FIG. 1B, a second alternative construction for the sense module 100" is described. In the arrangement of FIG. 1B, separate sense amplifiers 102 are provided for each of a plurality of bits that should be read in parallel (e.g., an 8-bit byte), yet a single timing unit 108 and a single reference unit 104 are provided to control the timing that the bits are read out and to generate a single reference signal to be used by all the sense amplifiers. Thus, a global timing signal and a global reference signal are used and a great saving in die area is realized. Because of the potential for differing offsets in the sense amplifiers 102-1 through 102-8, the window of operation of array cells using this configuration and the endurance of the memory array can be adversely impacted unless external schemes are used to compensate for sense amplifier offset.

Figure 2A:
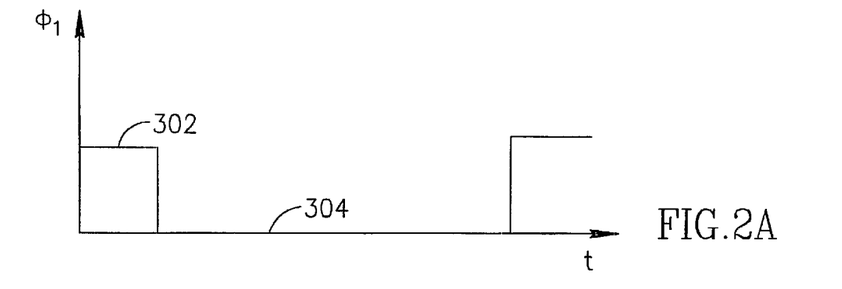
FIG. 2A is an illustration of a timing scheme of the entire sensing procedure.

The timing scheme of signal φ1 is shown in FIG. 2A. Signal φ1 has a section 302 which denotes the initialization phase. In this phase, both the array cell and the reference cell bit lines are first pre-charged to ground. The signal φ1 can also be used to initialize the sense amplifier 102, as indicated by the arrow leading into the sense amplifier in FIG. 1. Following the pre-charge to ground phase, in both the array and the reference unit accessed cells, the drain side bit line BLD of the accessed cell is driven high by the bit line voltage supply VBL while the source side bit line BLS is still maintained grounded. In parallel to the cells discharge and drain bit line voltage insertion, the accessed word line is driven high to the word line supply level at read, $V_{CCR}$. In the array, the accessed word line rises towards $V_{CCR}$ level or is already at $V_{CCR}$ level, depending on the previous and present addresses. In the reference unit, the reference cell gate voltage is stable at $V_{CCR}$ level. After the initialization phase, the signal φ1 changes state thereby triggering the start of the sensing phase. Signal φ1 remains in the changed state for a period, denoted 304, long enough for the array cell signal $V_{CELL}$ and the reference cell signal $V_{REF}$ to be developed. While $V_{CELL}$ and $V_{REF}$ develop, the sense amplifier 102 amplifies the difference ($V_{CELL}-V_{REF}$). At the end of period 304, signal φ1 changes state again, after which, sense module 100 provides a valid data output $V_{OUT}$, indicative of the content of the cell 10A.

Figure 2B:
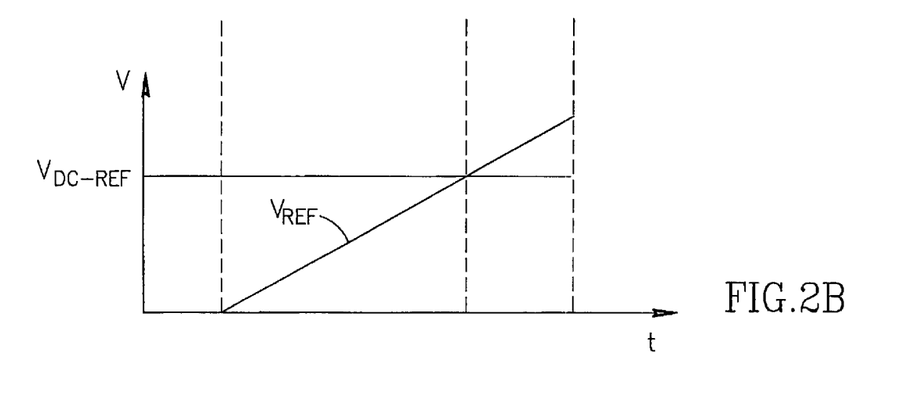
FIG. 2B is an illustration of a timing scheme of the amplification stage.

FIG. 2B illustrates the operation of timing unit 108. During period 304 of signal φ1 (FIG. 2A), the reference signal $V_{REF}$ begins developing from ground from a reference cell contained in the reference unit 104. As will be appreciated from the discussion below, the reference cell of the preferred embodiment has a non-strobed, always high ($V_{CCR}$ level) word line voltage applied to its gate, of a value equal to the supply voltage of the array word lines. Preferably, the same supply drives the reference cell and the array cell word lines. When signal $V_{REF}$ output by the reference cell reaches or exceeds a predetermined voltage level $V_{DC-REF}$ (typically at a low voltage level, such as 100–200 mV), timing unit 108 transitions at 308 to a logic high level digital timing signal φ2, shown in FIG. 2C, and is used as a timing signal. The transition 308 of the signal φ2 determines when the output of the sense amplifier 102 is to be read, and typically when it is to be latched, to produce a valid output signal VOUT from the sense module 100, that is, to produce an output signal which is representative of the data stored in cell 10A. As soon as the output $V_{OUT}$ of the sense module 100 is valid, the sensing phase ends and the signals φ1 and φ2 can return to their original states (see the end period in FIG. 2A and transition 310 of signal φ2 to a logic low state in FIG. 2C).

Figure 2C:
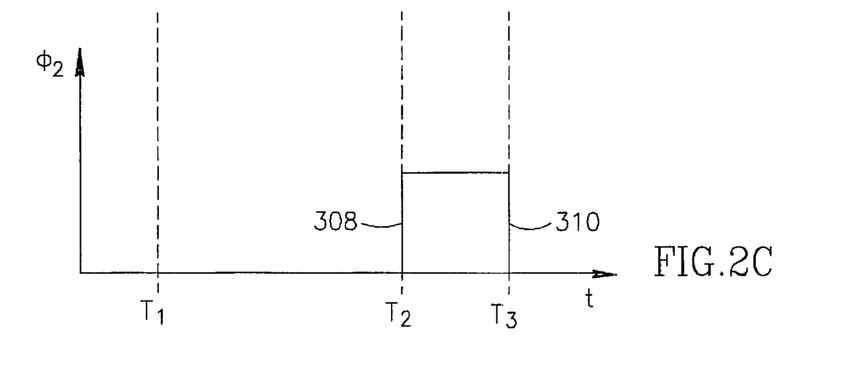
FIG. 2C is an illustration of the voltage profiles which are used for operating the timing unit of FIG. 1, according to a preferred embodiment of the present invention.
Figure 2D:
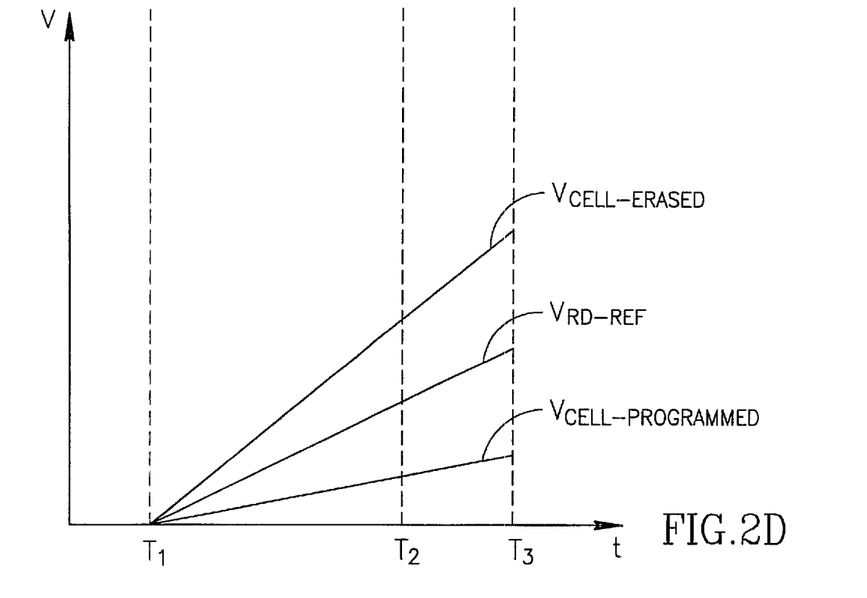
FIG. 2D is a schematic illustration of the voltage profiles which are present in the detection procedure.

FIG. 2D illustrates a standard read operation in which the inputs to the sense amplifier 102 are shown for two distinct cases. In one case, a programmed cell is read and the other case an erased cell is read. A standard read operation is performed using a "read reference cell" (denoted RD_REF in the figure) in the reference unit 104. At time T1, which occurs at the beginning of period 304 (FIG. 2A), reference unit 104 begins developing at the first sense amplifier input the reference signal $V_{RD\_REF}$ from ground. At the same time, the cell 10A, which was pre-charged to ground, begins developing at the second sense amplifier input the array cell signal $V_{CELL}$. The ramp rate of $V_{CELL}$ depends on the array cell's state. In the case of a programmed cell, the signal $V_{CELL\_PROGRAMMED}$ development rate will be slower than in the case of an erased cell's signal $V_{CELL\_ERASED}$ due to the different conductivity in the two states. Between times T1 and T2, the sense amplifier 103 amplifies the difference between the array cell and the reference cell signals ($V_{CELL}-V_{REF}$). This differential signal may be positive or negative depending on the cell's state. At time T2, a time determined such that the amplified difference signal ($V_{CELL}-V_{REF}$) is reliable for a read operation, the sensing phase ends. At this time, the sense amplifier 102 output can be read out or latched as a digital signal whose high or low level is determined by the sign of the differential signal ($V_{CELL}-V_{REF}$), indicating whether the array cell state is programmed or erased. The sensing process ends at T3, at which time the output signal $V_{OUT}$ of the sense module 100 is reliably latched or read out. At this time, the whole sensing module 100 may be reset to start a new read cycle, i.e., the array and reference unit are pre-charged to ground and the timing signal φ2 is reset.

As can be seen in FIG. 2D, the reference signal for a read operation $V_{RD\_REF}$ has a voltage profile between $V_{CELL\_ERASED}$ and $V_{CELL\_PROGRAMMED}$, and thus differentiates between the two states. In general, the reference signal placement may be achieved by one or more of the following steps:

1. Providing different supply levels to the array cell's gate and to the reference cell's gate (i.e., the array and the reference cells operate at different word line levels).
2. Providing different load capacitances (on which the signals are developed) to the array cell and to the reference cell.
3. Programming the reference cell to a state between (i.e., intermediate) the erased state and the programmed state of the array cells.

The first two methods described above will usually introduce some margin loss to the signal sensing process due to fluctuations in supply, temperature variations, and due to mismatches and/or unequal load capacitance ratios. In a preferred embodiment, the same word line supply voltage is used both for the array cells and for the reference cells. Likewise, a matched structure of the array cells, bit line loads, and access paths are used to obtain similar load capacitances for the array and the reference cells. Therefore, the reference signal placement is achieved by using a programmed reference cell. The programmed reference cell also ensures similar temperature coefficients for $V_{CELL}$ and $V_{REF}$. Therefore, the preferred embodiment using same word line supplies, a 1C:1C load capacitance ratio, and a programmed reference with a stable gate level ensures minimal margin loss in the sensing process.

Different types of read operations can be performed on the memory cell such as program verify, erase verify and operations in which temporary states of a cell in the progress of an erase or a program operation should be detected. The basic difference presented by these in-progress read cycles is the placement of the reference cell signal. Since the reference cell's state is not changed according to the type of the read operation, different reference cells should be used for each of these types of operations. Preferably, the reference unit 104 includes a selector 152 (shown in FIG. 3) which is used to select which of several reference cells 150, each programmed to a prescribed level, to use for a given operation. As used herein, the designation "$V_{REF}$" generally refers to a reference signal, which can be a read reference signal ($V_{RD\_REF}$), an erase verify signal ($V_{EV\_REF}$), a program verify signal ($V_{PV\_REF}$), or another signal that rises from ground potential concurrently with an array cell and is used as a reference to determine the state (or intermediate charge state) of an array cell ($V_{X\_REF}$).

Figure 2E:
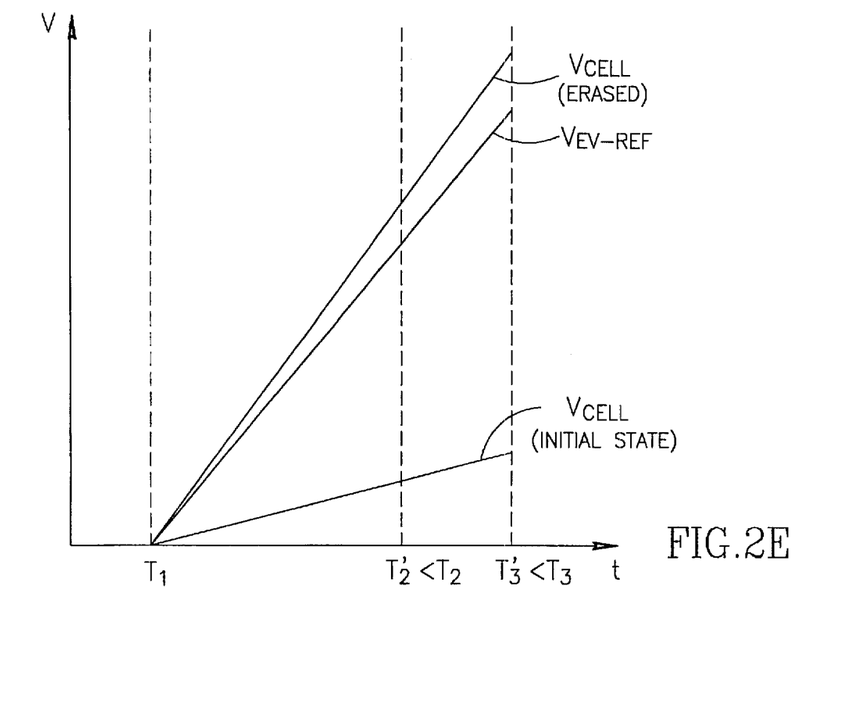
FIG. 2E is a schematic illustration of the voltage profiles which are present in an erase verify procedure.

FIG. 2E shows the input signals of the sense amplifier 102 during an erase verify operation. The erase verify operation is performed with regard to reference cell EV_REF. The reference unit 104 is as previously described but the reference cell that is used for this operation is the erase verify reference cell (EV_REF) which is in a prescribed, erased state. (A method for setting the amount of charge in the reference cell 150 is described in the aforesaid co-pending U.S. application Ser. No. 09/827,757, entitled "Method for Programming a Reference Cell.") At time T1, which corresponds to time T1 of FIGS. 2A–2D, reference unit 104 begins developing the $V_{EV\_REF}$ signal from ground. At the same time, the cell 10A, which was pre-charged to ground, begins developing the $V_{CELL}$ signal. Prior to being erased, the array cell signal is relatively low ($V_{CELL\_INITIAL\ STATE}$), corresponding to its programmed state. At time T2', a sensing period between times T1 and T2' ends. The comparison against the EV_REF cell will result in an output signal $V_{OUT}$ level that corresponds to a fail of the erase verification, at least until the array cell has been sufficiently erased. On the other hand, as the erase procedure continues and as soon as the array cell is erased to a state at which its signal is larger (($V_{CELL\_ERASED}$) than the EV_REF reference signal, the $V_{OUT}$ level read out at T2' will correspond to a successful erase verification.

The main difference between different types of read operations is the sensing phase time length (T3–T2). Reference is now made to FIGS. 2D and 2E which show the input signals of the sense amplifier 102 at a standard read cycle and at an erase verify read operation, respectively. The times T2 and T2' in FIGS. 2D and 2E are the timing signals generated by comparing the reference signal level to a predetermined DC_REF level. Since the RD_REF signal ramp rate is slower than that of the EV_REF signal, the timing signal T2 arrives later than T2'. Still, in both cases the sensing period ends with the reference signals reaching about the same level. The time period for executing an erase verify operation can be shortened or optimized relative to other operations such as the read operation, as will be discussed below.

It will be appreciated that the signals $V_{CELL}$ and $V_{REF}$ vary with temperature, as described in more detail hereinbelow. However, since they both depend on temperature in the same way and their current paths are matched, they will vary together; accordingly, they will maintain the relationships of which signal is higher and lower that are shown in FIGS. 2D and 2E Accordingly, the voltage level of cell 10A to be read can be sensed at fairly low voltages, such as—lower than 300 mV.

Figure 3:
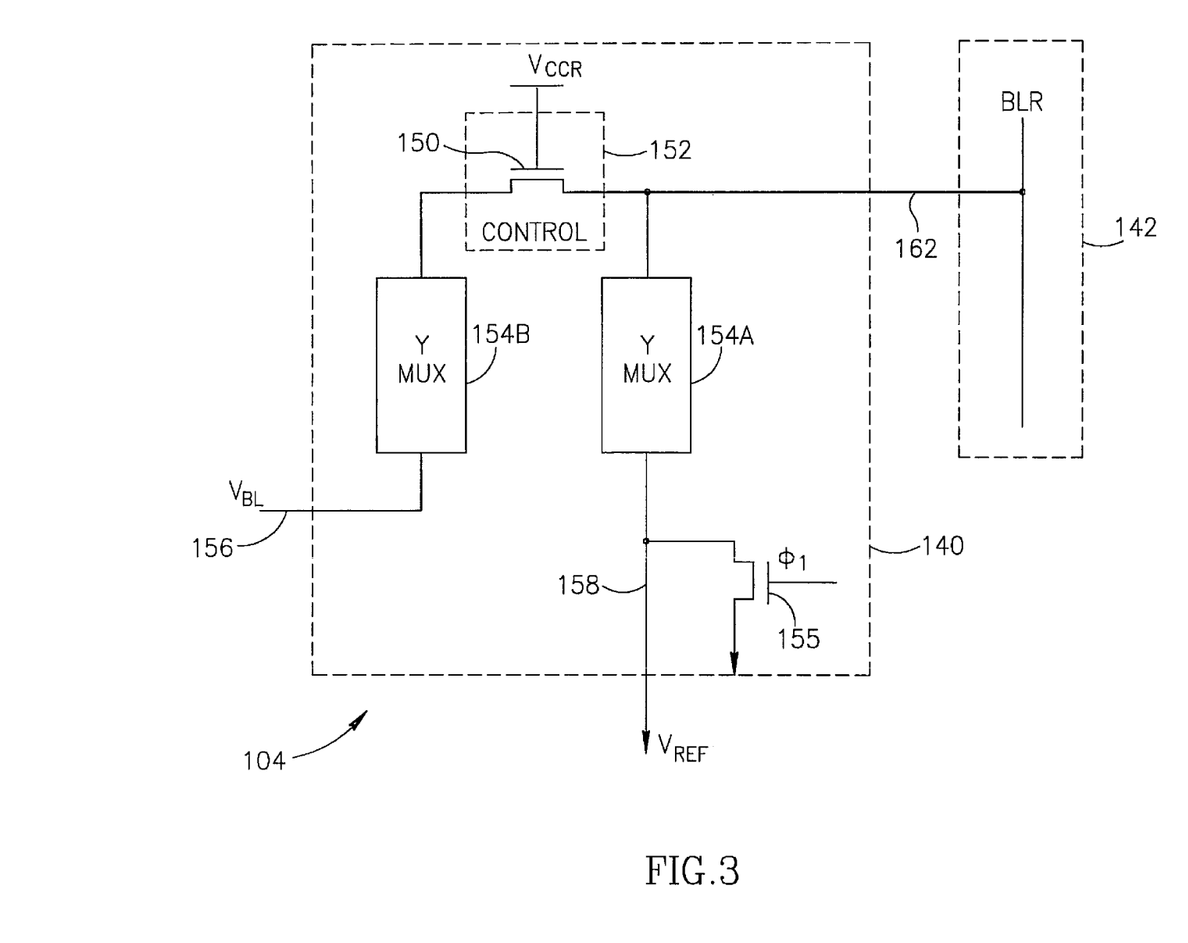
FIG. 3 is a schematic illustration of a reference unit of the sense amplifier of FIG. 1, constructed and operative in accordance with a preferred embodiment of the present invention.

Reference is now made to FIG. 3, which is a schematic illustration of the reference unit 104, constructed and operative in accordance with a preferred embodiment of the present invention.

Reference unit 104 includes a sensing emulator 140 and a bit line emulator 142, formed of reference bit line BLR. Sensing emulator 140 emulates the conditions and environmental behavior of the elements used to sense the data in cell 10A. The bit line emulator 142 emulates the capacitance of the bit line BLS connected to cell 10A. This capacitance affects the time it takes for the cell signal $V_{CELL}$ to develop to a desired level. Similarly, the capacitance of bit line BLR affects the time it takes for the reference signal $V_{REF}$ to develop to a desired level. Preferably, the capacitance of bit line BLR has a prescribed reference capacitance which is equal to an expected capacitance of one of the bit lines in the memory array, for example, a single bit line having the same structure. However, the number of bit lines BLR that are used can be varied to change the slope of the $V_{REF}$ curve, for example, as an alternative to or to augment the degree of programming or erasing imparted to a reference cell within the sensing emulator of the reference unit 104.

Sensing emulator 140 includes a reference cell 150, a multiplexor 154 which includes a source section 154A and a drain section 154B, and an NMOS switching transistor 155. Reference cell 150 emulates cell 10A to be sensed. Drain section 154B, which connects between a supply line 156 carrying supply $V_{BL}$ and reference cell 150, emulates the expected path from supply line 14 through Y decoder 12 to cell 10A. Typically this path has a few transistors therein. Similarly, source section 154A, which connects between reference cell 150 and an output line 158, emulates the expected path from cell 10A through Y decoder 12 to sensing line 16 and does so with a few transistors. In accordance with the present invention, a constant, non-strobed voltage is applied to the gate electrode of the reference cell 150 which is equal to the word line supply voltage that is applied to a selected (addressed) array cell. The non-strobed architecture is sometimes referred to herein as a cell configured for "strobe free operation." Preferably, the word line of the reference cell ("$V_{WL\_REF}$") is connected to the $V_{CCR}$ level array word line supply.

A selector 152 controls which reference cell 150 is being read at any given time. A plurality of reference cells 150 (only one shown) can be provided, each programmed to a prescribed level to perform a specific operation. For example, one reference cell can be programmed for a read operation, another for a program verify operation, another for an erase verify operation, and further reference cells can be provided for other operations. The selector 150 responds to an input control signal by connecting one reference cell in lieu of another. The control signal is provided by conventional controller circuitry which defines the current read operation to be done on a particular cell in the memory array.

Switching transistor 155, which emulates switching transistor 18 and is controlled by φ1, controls when reference signal $V_{REF}$ is grounded and when it can develop. As for switching transistor 18, when φ1 is high, switching transistor 155 grounds the reference signal. When φ1 is low, switching transistor 155 has no effect on reference signal $V_{REF}$ and it can develop.

According to the present invention, reference cell 150 is a cell of the same size as cells 10 of the array, and it is constructed with a matched environment, current paths, and loads as the array cells. Hence, reference cell 150 can provide a current which depends on temperature and voltage supplies in the same manner as cell 10A to be read. Furthermore, reference cell 150 is brought from its native state to a programmed state, an erased state, or an intermediate state and so the voltage profile of reference cell 150 has a desired slope for the operation being performed.

The signal $V_{REF}$ is also affected by bit line emulator 142 which is connected to a source 162 of reference cell 150. As mentioned hereinabove, bit line emulator 142 includes a bit line BLR which has a capacitance $C_{BL}$ associated therewith. The number of bit lines BLR that are connected to the source of the reference cell 150 affects the ratio of the capacitance of bit line emulator 142 to the capacitance $C_{BLS}$ felt by cell 10A. Preferably, the ratio of capacitances is equal, that is, $C_{BLR}=C_{BLS}$ so that environmental condition variations (e.g., supply voltages and temperature) affect both cells equally.

It will be appreciated that the reference signal VREF depends on the responses of reference cell 150 and bit line emulator 142 to the presence of voltage supply $V_{BL}$. Since both reference cell 150 and bit line emulator 142 have the same responses as their complements, cells 10 and bit lines BL of the array, respectively, and since switching transistors 18 and 155 become inactive at the same time, the reference and data signals $V_{REF}$ and $V_{CELL}$, respectively, respond to changes in their environment, particularly those of temperature and power supply levels, in the same way. As a result, their difference sensed and amplified by the sense amplifier 102, does not change when the environment changes. Because of this, the sensing module 100 can determine the state of cell 10A to be read despite environmental changes.

Figure 4:
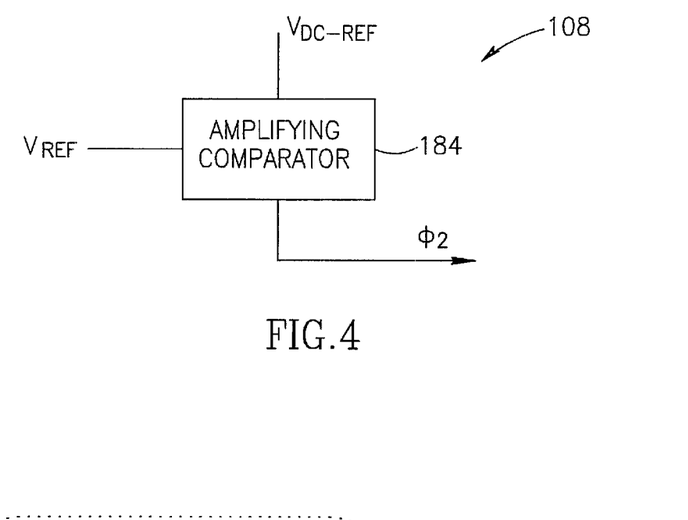
FIG. 4 is a schematic illustration of a timing unit of FIG. 1, constructed and operative in accordance with a preferred embodiment of the present invention.

Reference is now made to FIG. 4, which is a schematic illustration of timing unit 108, constructed and operative in accordance with a preferred embodiment of the present invention.

Timing unit 108 is of relatively simple construction and includes only an amplifying comparator 184.

One input of the amplifying comparator 184 (FIG. 4) is connected to the $V_{REF}$ output of the reference unit 104. The second input of the amplifying comparator 184 is connected to a voltage source (not shown), which provides a direct current (DC) reference voltage level $V_{DC-REF}$. Typically, reference voltage level $V_{DC-REF}$ is set to a low voltage level, such as 50–200 mV.

Comparator 184 compares between the voltage $V_{REF}$, which is provided by the reference unit 104, and DC reference voltage $V_{DC-REF}$. Comparator 184 changes the state of its output φ2 when the voltage $V_{REF}$ rises above reference voltage $V_{DC-REF}$.

Since $V_{REF}$ starts developing at the same time as $V_{CELL}$, the timing unit 108 permits a predetermined reference voltage level to be selected in advance, to ensure signal development in an array cell from ground potential to a value sufficient to permit reliable sensing. Essentially, the timing circuit of the preferred embodiment depends on the program state of the reference cell, since the voltage rise in a cell is a function of whether it is in a programmed state (in which case the voltage development is comparatively slow) or in an erased state (in which case the voltage development is comparatively fast), or somewhere in between (e.g., the reference cell is programmed to a partially programmed or erased state). The time when output φ2 of the timing unit changes state is a function of the program state of the reference cell being used (i.e. it is a function of the type of read operation being performed) and of the value selected for the DC voltage reference level. The signal developing at the reference cell source bit line will rise at a rate related to its program state, and the φ2 signal will remain low until the DC reference voltage level is met. Thereafter, the φ2 signal will be high, as shown in FIGS. 2B and 2C. When φ2 is high, the contents of the array cell are sensed. Consequently, the time period for signal development in an array cell varies with the program state of the reference cell that has been selected. Furthermore, the selection of the DC_REF level to be used determines at what signal levels the array cell and the reference cell signals will be compared. The lower the DC_REF level that is chosen, the faster the sensing period will be. However, the timing performance benefit comes at the cost of a more sensitive comparison at the sense amplifier 102 due to the lower signal levels. Accordingly, a balance can be struck between speed and sensitivity by selecting the DC_REF level to be used.

In one particular embodiment of the invention, the time period for effecting a given operation on a memory cell in the array is optimized by selecting prescribed, different DC voltage reference levels $V_{DC\_REF}$ for different operations. By way of example, for a read operation, a 100 mV reference level may permit sufficient signal development in an array cell (and the read reference cell) to read its contents at a given time, whereas a lower DC reference voltage level for a program verify operation may be adequate to permit fast sensing at a sufficient and reliable signal level.

Figure 4A:
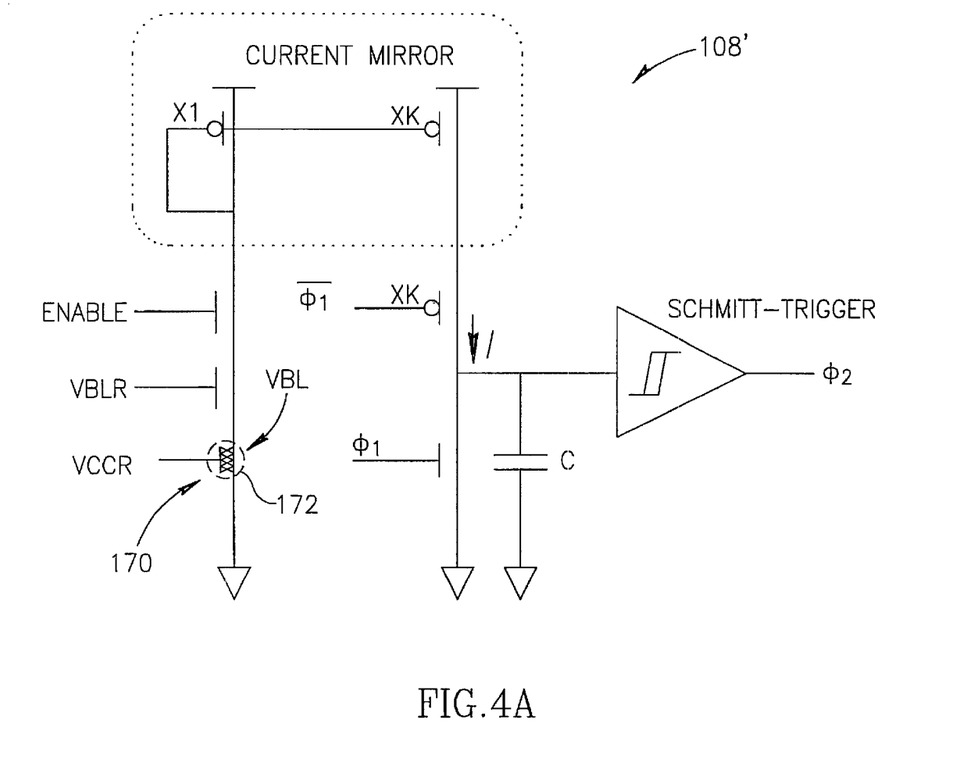
FIG. 4A, is a schematic illustration of an alternative arrangement for the timing unit 108 of FIG. 1.

In FIG. 4A, an alternative embodiment of the timing unit 108 is illustrated. The timing unit 108' of FIG. 4A consumes less area on a die and in some cases provides a better tracking of environmental conditions than that of FIG. 4. The timing unit 108' includes a programmed memory cell 170, selected by a selector 172 (which is similar in design to the selector 152) according to the read operation that is to be performed. The memory cell 170 has the same structure, capacitance load, and voltages applied to it as does the array cell and, therefore, exhibits a closely tracking operational and environmental response to that of the array cell. The programming level of cell 170 is similar to that of the reference cell used in the read operation being performed. Consequently, when the timing unit 108' outputs the signal φ2, it is at a time when the reference signal from the reference cell 150 has developed to a prescribed level which is nearly independent of operational and environmental conditions. The circuit of FIG. 4A includes a capacitance C which begins charging at T1 in response to current I. The current I is a multiple of the current flowing through the timing unit cell 170. The magnitude of the current I can be set by a trimmable current mirror. As understood by those of skill in the art, the components (e.g., switches) for trimming the current mirror are conventional and therefore are not illustrated. The timing delay provided by this circuit consists of the time taken to charge a voltage across capacitor C to a level sufficient to trip a Schmitt trigger (at time T2). This time can be adjusted in a variety of ways including, but not limited to, varying the size of the capacitance C and changing the gain K of the current mirror. When tripped, the Schmitt trigger generates the signal φ2 which is provided to the sense amplifier 102. Instead of a Schmitt trigger, a simple inverter can be used. The timing unit 108' in FIG. 4A operates with large signals. The timing signal is generated as soon as the voltage across capacitor C reaches the Schmitt trigger trip point, which is usually higher than 1V. This is in contrast to the timing unit 108 of FIG. 4 in which the generation of the timing signal is a result of a signal comparison at a relative low level (e.g. 100–200 mV). The main advantage of operating with large signals is that the Schmitt trigger type of comparator delay is shorter than the low voltage amplifying comparator of FIG. 4. This delay should be preferably as small as possible since it does not track the array cells' characteristics.

Figure 5:
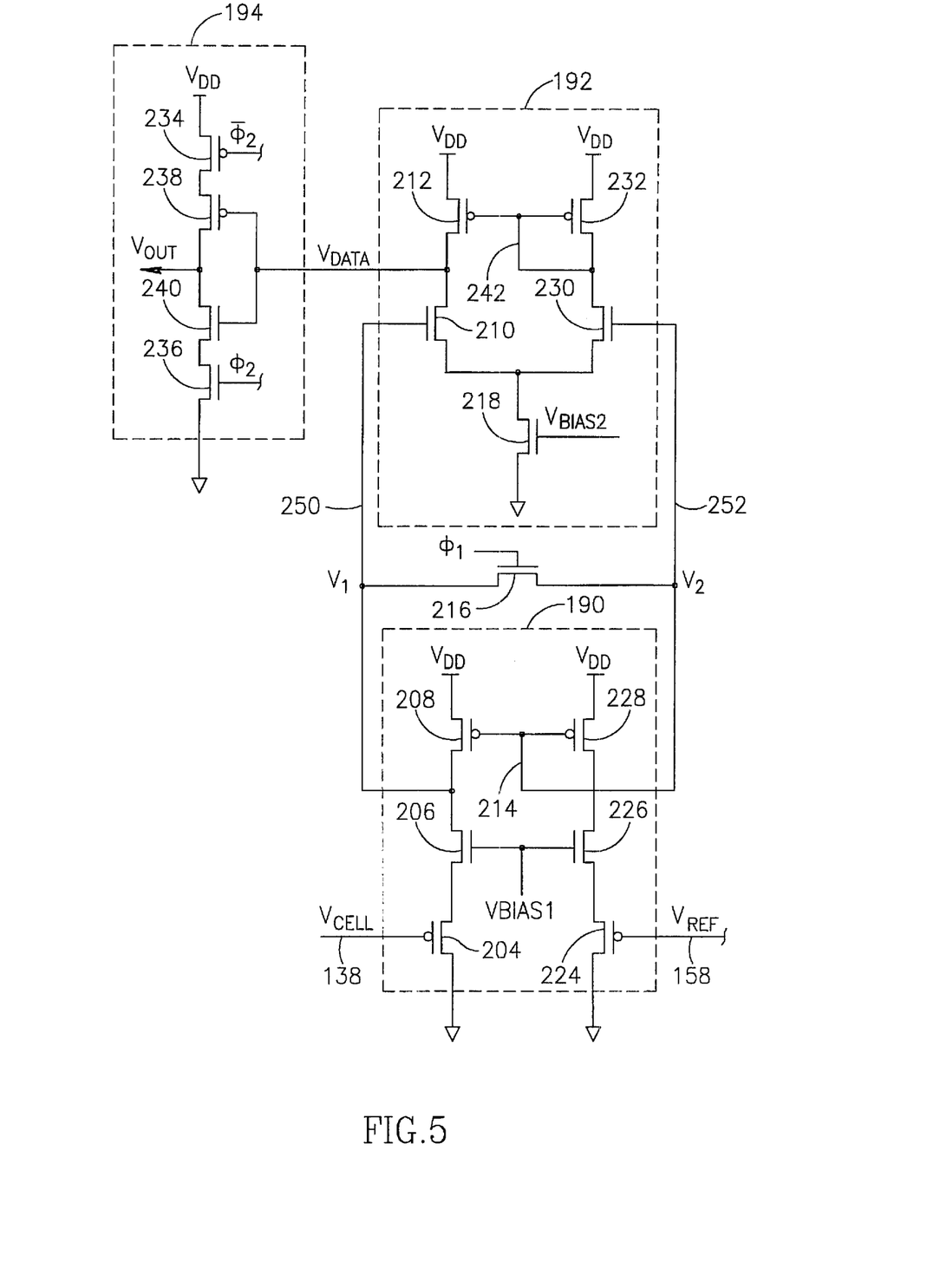
FIG. 5 is an illustration of an amplifying comparator of FIG. 1, constructed and operative in accordance with a preferred embodiment of the present invention to perform a read operation.

Reference is now made to FIG. 5, which is a circuit drawing of one particular sense amplifier 102 that forms no part of the present invention. The sense amplifier is used in connection with the various operations discussed above such as a read operation and is described herein for completeness. A number of sense amplifier designs can be used in lieu of the particular circuit illustrated in FIG. 5, which circuit is merely exemplary. The circuit of FIG. 5 is typically utilized for both amplifying comparators 102 and 184. For circuit 102 the two input signals are $V_{CELL}$ and $V_{REF}$, while for circuit 184 the two input signals are $V_{REF}$ and $V_{DC-REF}$. FIG. 5 shows the former case, for simplicity.

The amplifying comparator includes a preamplifier 190 (formed of a double ended differential amplifier), a single ended differential comparator 192 and a final stage 194. Preamplifier 190 amplifies the low voltage signals $V_{CELL}$ and $V_{REF}$ and produces therefrom two signals $V_1$ and $V_2$, respectively. Differential comparator 192 produces an amplified difference signal $V_{DATA}$ indicative of the difference between amplified signals $V_1$ and $V_2$, and final stage 194 converts the difference signal to a logical one having either a 0 or a 1 value associated therewith.

It will be appreciated that amplifying comparator 102 provides a high gain signal from the two low voltage signals $V_{CELL}$ and $V_{REF}$, irrespective of temperature or power supply Vdd variations.

Preamplifier 190 includes transistors 204, 206, 208, 224, 226 and 228. The drain of transistors 204 and 224 are connected to the ground. The gate of transistor 204 (a p-channel transistor) is connected to the sensing line 138 which carries $V_{CELL}$ thereon. The gate of transistor 224 (a p-channel transistor) is connected to output line 158 which carries $V_{REF}$ thereon. The source of transistor 204 is connected to the source of transistor 206. The source of transistor 224 is connected to the source of transistor 226.

The gates of transistors 206 and 226 are connected to a voltage source, which applies a voltage level of $V_{BIAS1}$. The drains of transistors 206 and 226 are connected to the drains of transistors 208 and 228, respectively. The source of transistors 208 and 228 are connected to a power supply $V_{DD}$. The gate of transistor 208 is connected to the gate and drain of transistor 228 (see connector 214).

The drains of transistors 208 and 228 are interconnected via a switching transistor 216 (an n-channel transistor), which is activated by control signal φ1. Switching transistor 216 equates the outputs $V_1$ and $V_2$ of the pre-amplifier section by short-circuiting lines 250 and 252. When φ1 rises (section 302 of FIG. 2A), switching transistor 216 is activated. As φ1 descends, switching transistor 216 is deactivated and preamplifier 190 produces output signals $V_1$ and $V_2$. It is noted that $$V_1 = V_2 + K_1(V_{CELL} - V_{REF}) \text{ and } V_2 = V_0 + K_2 V_{REF}$$

where $V_0 = V_1 = V_2$ when $V_{CELL} = V_{REF} = 0$ and $K_1$ denotes the amplification of preamplifier 190 for the differential input signal $V_{CELL} - V_{REF}$ and $K_2$ denotes the amplification of preamplifier 190 for $V_{REF}$.

Comparator 192 includes transistors 210, 212, 218, 230 and 236. Comparator 192 also provides additional amplification of the signals $V_1$ and $V_2$. The source of transistor 218 is connected to the ground. The gate of transistor 218 is connected to a voltage source, which provides a voltage level of $V_{BIAS2}$.

The drain of transistor 218 is connected to the source of transistors 210 and 230. The gate of transistor 210 is connected to the drain of transistor 208. The gate of transistor 230 is connected to the drain of transistor 228. The drain of transistor 210 and 230 are connected to the drains of transistors 212 and 232, respectively. The gate of transistor 212 is connected to the gate and drain of transistor 232 (see connector 242).

The sources of transistors 212 and 232 are connected to a voltage source that provides the supply $V_{DD}$.

At the output of comparator 192, the signal $V_{DATA}$ is determined according to the following:

$$V_{DATA}=V_{DATA\text{-}0}+K_3(V_2-V_1)=V_{DATA\text{-}0\_}+K_1K_3(V_{CELL}-V_{REF})$$

where $V_{DATA\text{-}0}=V_{DATA}$, when $V_1=V_2$ and $K_3$ denotes the amplification of comparator 192.

Final stage amplifier 194 includes switching transistors 234 and 236 and transistors 238 and 240, formed as an inverter. Switching transistor 234 (a p-channel transistor) is connected between the source of transistor 238 and voltage supply $V_{DD}$. It is noted that switching transistors 234 and 236 are not present for amplifying comparator 184 of timing unit 108.

Switching transistor 236 (an n-channel transistor) is connected between the source of transistor 240 and the ground. The gates of transistors 238 and 240 are connected to the output of comparator 192 (i.e. the drain of transistors 210 and 212) thereby receiving signal $V_{DATA}$ which is the pre-amplified result of the comparison between the incoming voltage levels $V_{CELL}$ and $V_{REF}$.

The drain of transistors 238 and 240 forms the output of the entire circuit, providing an amplified output signal indicative of the content of the sensed cell. It is noted that final stage amplifier 194 converts the analog signal $V_{DATA}$ to a digital signal $V_{OUT}$.

Switching transistors 234 and 236 are operated by timing signals (inverse) φ2 and φ2 (FIG. 2C), respectively, produced by the timing unit 108. When signal (inverse) φ2 is low and φ2 is high, switches 234 and 236, respectively, are activated and hence, transistors 238 and 240 are powered so as to produce output signal $V_{OUT}$. When (inverse) φ2 is high (i.e., during output period 308) and φ2 is low, the switches 234 and 236 are deactivated and hence, there is no output signal at the drain of transistors 238 and 240.

It is noted that amplifying comparator 102 provides detection of the content of a cell to be sensed, for very small voltage levels, wherein $$|V_{CELL}-V_{REF}|10\text{ mV}$$

and where $V_{OUT}$ (of an erased cell) is on the order of $V_{DD}$.

Persons skilled in the art will appreciate that the present invention is not limited to what has been particularly shown and described hereinabove. Rather the scope of the present invention is defined only by the claims that follow.

We claim:

1. A method for sensing a close to ground signal received from an array cell within a memory array having a plurality of bit lines, the method comprising the steps of:
   a) providing a reference unit with a reference cell having a similar structure and a similar current path therethrough to that of said array cell, said reference unit having a single prescribed reference capacitance and said reference cell gate terminal being driven by a non-strobed word line voltage;
   b) discharging and then charging both said array cell and said reference unit, thereby generating a cell signal and a reference signal, respectively;
   c) providing a timing unit which is operative to generate a timing signal; and
   d) generating a read output signal from the difference of said cell and reference signals once said timing signal is generated.

2. The method as in claim 1, wherein said array cell has a word line supply and wherein said non-strobed word line voltage is at the same voltage level as the word line supply.

3. The method as in claim 1, wherein said prescribed reference capacitance is equal to an expected capacitance of one of the bit lines of said array.

4. The method as in claim 1, wherein the timing unit includes a comparator, the comparator receiving as a first input the reference signal and as a second input a predetermined DC reference voltage and outputting the timing signal in response to a match at its first and second inputs.

5. The method as in claim 1, wherein said step of generating a read output includes the steps of amplifying said reference and cell signals, generating a difference signal representing the difference between said amplified reference and cell signals and converting said difference signal to a indicative of a logic state signal.

6. The method as in claim 1, wherein the memory array comprises a plurality of sliced arrays, each sliced array including at least one column of memory cells.

7. A method for sensing a close to ground signal received from an array cell within a memory array having a plurality of bit lines, the method comprising the steps of:
   a) providing a reference unit with a reference cell having a similar structure and a similar current path therethrough to that of said array cell, said reference unit having a single prescribed reference capacitance and said reference cell gate terminal being driven by a non-strobed word line voltage;
   b) discharging and then charging both said array cell and said reference unit, thereby generating a cell signal and a reference signal, respectively;
   c) providing a timing unit which is operative to generate a timing signal when said reference signal transitions a predetermined voltage level; and
   d) generating a read output signal from the difference of said cell and reference signals once said timing signal is generated.

8. The method as in claim 7, wherein said non-strobed word line voltage is a non-zero voltage applied to a gate electrode of the reference cell.

9. The method as in claim 7, wherein said array cell has a word line supply and wherein said non-strobed word line voltage is at the same voltage level as the word line supply.

10. The method as in claim 9, wherein said prescribed reference capacitance is equal to an expected capacitance of one of the bit lines of said array.

11. The method as in claim 10, wherein the prescribed reference capacitance includes a single bit line having the same structure as said array bit line.

12. The method as in claim 7, wherein the array cell has a capacitance C and wherein the prescribed reference capacitance has a value which is a multiple of C.

13. The method as in claim 7, wherein the timing unit includes a comparator, the comparator outputting the timing signal in response to a match at its inputs.

14. The method as in claim 13, wherein the comparator receives as a first input the reference signal and as a second input a predetermined DC reference voltage.

15. The method as in claim 7, wherein said step of generating a read output signal includes the steps of amplifying said reference and cell signals, generating a difference signal representing the difference between said amplified reference and cell signals and converting said difference signal to a indicative of a logic state signal.

16. The method as in claim 7, wherein the memory array comprises a plurality of sliced arrays, each sliced array including at least one column of memory cells.

17. An apparatus for sensing a close to ground array cell signal received from an accessed array cell within a memory array, the accessed array cell responding to a gate voltage applied to a gate thereof with an array cell signal, the apparatus comprising:
   a) a reference unit having a reference cell whose structure emulates the response of an array cell and a reference capacitance which is substantially equal to an expected capacitance of a bit line of said memory array, the reference cell gate terminal being driven by a non-strobed word line voltage and outputting a reference signal;
   b) a timing unit operative to output a timing signal; and
   c) a differential sense amplifier responsive to said timing signal to provide a read output signal proportional to the difference between said array cell signal and said reference signal.

18. The apparatus as in claim 17, wherein the reference cell has a similar structure to that of said array cell, said reference unit further comprising;
   a reference multiplexor having a similar current path therethrough to that of said array cell;
   a single reference bit line which provides said reference capacitance, wherein said reference bit line has the same structure as said array bit line; and
   a reference discharge unit for discharging and charging said reference bit line along with said array cell and for generating said reference signal during charging of said reference unit.

19. The apparatus as in claim 18, wherein the reference cell receives a gate signal at a constant voltage level that is the same as the gate voltage applied to the gate of the array cell.

20. The apparatus as in claim 18, wherein said reference unit comprises a plurality of reference cells each having a similar structure to that of said array cell and each being programmed to a prescribed state.

21. The apparatus as in claim 20, further comprising a selector responsive to a control signal to select one of said plurality of reference cells in accordance with an operation to be performed.

22. The apparatus as in claim 18, wherein the timing unit outputs the timing signal with regard to an input reference signal, and wherein the reference signal is selected in accordance with the reference cell.

23. The apparatus as in claim 17, wherein the timing unit outputs the timing signal with regard to an input reference signal, and wherein the reference signal is selected in accordance with the operation to be performed.

24. The apparatus as in claim 17, wherein said timing unit comprises a comparator having a first input connected to the reference signal and a second input connected to a predetermined voltage level, the timing unit outputting the timing signal when said reference signal reaches said predetermined voltage level.

25. The apparatus as in claim 24, wherein said predetermined voltage level is selected in accordance to the operation to be performed.

26. The apparatus as in claim 17, wherein said timing unit comprises:
   a timing unit cell having a similar structure and programming state to that of said reference cell;
   a current amplifier which outputs an integrating current;
   said integrating current having a magnitude proportional to the timing cell current,
   a capacitance charged by the integrating current; and
   an output circuit which changes state when the voltage across the capacitor develops to a predetermined level to thereby output the timing signal.

27. The apparatus as in claim 17, wherein said differential sense amplifier comprises:
   a first stage that shifts the input signals from a level lower than 500 mV to a level higher than 500 mV;
   at least one differential amplifying stage with a total gain greater than 10; and
   an output driving stage controlled by a timing signal that provides the read output signal.

28. The apparatus as in claim 17, wherein a plurality of array cells are accessed in parallel, each responding to the applied gate voltage with a respective array cell signal, and wherein there are a plurality of differential sense amplifiers each being responsive to a common timing signal from said timing unit to provide a read output signal proportional to the difference between a respective one of said array cell signals and said reference signal.

29. An apparatus for sensing a close to ground array cell signal received from a plurality of N accessed array cells within a memory array, the accessed array cells each responding to a gate voltage applied to gates thereof with respective array cell signals, the apparatus comprising:
   a) a timing unit operative to output a timing signal; and
   b) for each of said N array cells,
      a reference unit having a reference cell whose structure emulates the response of the array cell and a reference capacitance which is substantially equal to an expected capacitance of a bit line of said memory array, the reference cell gate terminal being driven by a non-strobed word line voltage and outputting a reference signal;
      a differential sense amplifier responsive to said timing signal to provide a read output signal proportional to the difference between said array cell signal and said reference signal.

30. The apparatus as in claim 29, wherein said reference cell has a similar structure to that of said array cell and wherein said reference unit comprises:
   a reference multiplexor having a similar current path therethrough to that of said array cell;
   a single reference bit line which provides said reference capacitance, wherein said reference bit line has the same structure as said array bit line; and
   a reference discharge unit for discharging and charging said reference bit line along with said array cell and for generating said reference signal during charging of said reference unit.

31. The apparatus as in claim 30, wherein the reference cell receives a gate signal at a constant voltage level that is the same as the gate voltage applied to the gate of the array cell.

32. The apparatus as in claim 29, wherein said reference unit comprises a plurality of reference cells each having a similar structure to that of said array cell and each being programmed to a prescribed state.

33. The apparatus as in claim 32, further comprising a selector responsive to a control signal to select one of said plurality of reference cells in accordance with an operation to be performed.

34. The apparatus as in claim 29, wherein the gate voltage is selected in accordance to the operation to be performed.

35. The apparatus as in claim 29, wherein said timing unit comprises:
   a timing unit cell having a similar structure and programming state to that of said reference cell;
   a current amplifier which outputs an integrating current;
   said integrating current having a magnitude proportional to the timing cell current,
   a capacitance charged by the integrating current; and
   an output circuit which changes state when the voltage across the capacitor develops to a predetermined level to thereby output the timing signal.

36. The apparatus as in claim 29, wherein the timing unit outputs the timing signal with regard to an input reference signal, and wherein the reference signal is selected in accordance with the operation to be performed.

37. The apparatus as in claim 29, wherein the timing unit outputs the timing signal with regard to an input reference signal, and wherein the reference signal is selected in accordance with the structure of the reference unit.

38. An apparatus for sensing a close to ground array cell signal received from a plurality of N accessed array cells within a memory array, the accessed array cells each responding to a gate voltage applied to gates thereof with respective array cell signals, the apparatus comprising:
   a) a timing unit operative to output a timing signal;
   b) a reference unit having a reference cell whose structure emulates the response of one of the array cells within the memory array and a reference capacitance which is substantially equal to an expected capacitance of a bit line of said memory array, the reference cell gate terminal being driven by a non-strobed word line voltage and outputting a reference signal;
   c) a plurality of differential sense amplifiers, each responsive to said timing signal to provide a read output signal proportional to the difference between one of said N array cell signals and said reference signal.

39. The apparatus as in claim 38, wherein said reference cell has a similar structure to that of said array cell, and wherein said reference unit comprises:
   a reference multiplexor having a similar current path therethrough to that of said array cell;
   a single reference bit line which provides said reference capacitance, wherein said reference bit line has the same structure as said array bit line; and
   a reference discharge unit for discharging and charging said reference bit line along with said array cell and for generating said reference signal during charging of said reference unit.

40. The apparatus as in claim 39, wherein the reference cell receives a gate signal at a constant voltage level that is the same as the gate voltage applied to the gate of the array cell.

41. The apparatus as in claim 38, wherein said reference unit comprises a plurality of reference cells each having a similar structure to that of said array cell and each being programmed to a prescribed state.

42. The apparatus as in claim 41, further comprising a selector responsive to a control signal to select one of said plurality of reference cells in accordance with an operation to be performed.

43. The apparatus as in claim 38, wherein the gate voltage is selected in accordance to the operation to be performed.

44. The apparatus as in claim 38, wherein said timing unit comprises:
   a timing unit cell having a similar structure and programming state to that of said reference cell;
   a current amplifier which outputs an integrating current;
   said integrating current having a magnitude proportional to the timing cell current,
   a capacitance charged by the integrating current; and
   an output circuit which changes state when the voltage across the capacitor develops to a predetermined level to thereby output the timing signal.

45. The apparatus as in claim 38, wherein the timing unit outputs the timing signal with regard to an input reference signal, and wherein the reference signal is selected in accordance with the operation to be performed.

46. The apparatus as in claim 38, wherein the timing unit outputs the timing signal with regard to an input reference signal, and wherein the reference signal is selected in accordance with the structure of the reference unit.

* * * * *